United States Patent [19]

Kidder et al.

[11] Patent Number: 4,646,676
[45] Date of Patent: Mar. 3, 1987

[54] ADHESIVE DISPENSER

[75] Inventors: Robert A. Kidder, Lowell, Mass.; Stanley R. Vancelette, Manchester, N.H.; Willis B. Whalen, Wilmington; Robert D. Di Nozzi, Beverly, both of Mass.

[73] Assignee: USM Corporation, Flemington, N.J.

[21] Appl. No.: 778,237

[22] Filed: Sep. 20, 1985

Related U.S. Application Data

[63] Continuation-in-part of Ser. No. 441,261, Nov. 15, 1982, abandoned.

[51] Int. Cl.$^4$ .............................................. B05C 1/16
[52] U.S. Cl. ..................................... 118/243; 118/263
[58] Field of Search ................................ 118/243, 263

[56] References Cited

U.S. PATENT DOCUMENTS 4,112,531  9/1978  Mitter .............................. 118/243 X
4,146,339  3/1979  Fleming et al. ................ 118/263 X

FOREIGN PATENT DOCUMENTS 1577763  11/1969  Fed. Rep. of Germany ...... 118/243

Primary Examiner—John P. McIntosh
Attorney, Agent, or Firm—Alan N. McCartney

[57] ABSTRACT

An adhesive dispenser for metering very small quantities of viscious liquids (grease-like materials) or thick pastes (putty-like materials) and transferring the metered material as a hemispherical or conical dot to a substrate at a high rate of speed. This device can be used to place adhesives between the conductive lands of a printed circuit board to adhere "chip type" electronic components between the conductive lands of the board. The dispenser comprises an outer cylinder carried in a support housing for movement toward and away from the board, the outer cylinder carries an adhesive metering device which places a dot of adhesive on the board.

6 Claims, 4 Drawing Figures

ADHESIVE DISPENSER

This application is a continuation in part of U.S. patent application Ser. No. 441,261, filed Nov. 15, 1982, now abandoned.

BACKGROUND OF THE INVENTION

In the U.S. patent application Ser. No. 299,979 filed Sept. 8, 1981 (assigned to the assignee of the invention disclosed herein and now U.S. Pat. No. 4,501,064 granted Feb. 26, 1985) there is disclosed an invention for a machine for placing chip type electronic components on a printed circuit board at a very high rate of speed. This machine requires an adhesive dispenser for dispensing a non-conductive adhesive onto a printed circuit board between the conductive lands on the board. The chip is subsequently placed onto the adhesive to make the chip adhere to the board between the conductive lands. The board can be later processed through wave soldering apparatus to make the final electrical bond between the component and the conductive lands on the board.

In investigating available apparatus for dispensing the adhesive it became apparent that such an apparatus must accurately dispense very small amounts of a thick paste-like material at a rate of at least four times a second with sufficient reliability to be incorporated into an automatic system without causing any potential system down-time to exceed the time necessary to repair any other operating parts of the system. All of these requirements additionally must be accomplished by using the mechanical and electrical resources available on the component placement machine.

There are generally two methods of applying or depositing drops of fluid at specified locations; the transfer method and by the direct application. An example of the transfer method is a rubber ink stamp where the fluid is picked up by an applicator and deposited where desired. Available apparatus using this method of applying adhesives to a printed circuit board are undesirable since they are not general purpose devices, must be especially designed and built for specific application and as a rule are not programmable.

Direct application of a fluid to a substrate is accomplished by inducing the fluid to flow from a reservoir to an applicator having an orifice that deposits the fluid. The fluid is caused to flow through a conduit from the reservoir to an applicator by some type of displacement means caused either by compressed air (pneumatic) or mechanical reduction of the reservoir volume to move the fluid.

There are two ways of using the pneumatic displacement method to induce fluid flow. The simple way is to apply pressure to a reservoir when the flow of material is desired and relieve pressure when the required amount is obtained from the applicator. When used with relative thin fluids, these devices are sometimes rigged so that a mild vacuum (termed "suckback") is applied to the reservoir when the pressure is removed in order to prevent the fluid from escaping spuriously (drooling) from the applicator under the effects of gravity or capillary action. In these devices, blunt hollow needles are commonly used as the outlet orifice of the applicator.

The second method of using pneumatics for dispensing fluids involves keeping the reservoir pressurized constantly whenever the system is in use. A valve is interposed between the reservoir and the applicator to control the release of the fluid. These valves can be manually operated or actuated by electrical, pneumatic, hydraulic or various mechanical linkages. In these devices the fluid must travel through the inner workings of the valve and when the fluid is an adhesive that can setup or harden, the valve becomes non-functional until cleaned.

With regard to using a mechanical means to reduce the reservoir volume to move the fluid, this can be done by either using a plunger acting on the fluid or by squeezing the reservoir.

None of the prior art devices of the nature described provide for metering a small amount of paste-like adhesive with a degree of repeatability and reliability within a specified limited time interval for application to a chip type component placement machine. The devices mentioned utilized a hollow needle as the outlet of the applicator. The object is to have the adhesive protrude beyond the end of the needle and bring the needle outlet adjacent the printed board substrate to apply the small amount of adhesive to the desired location. In theory, the protruding material will separate from the main mass of adhesive at the plane of the outlet and remain on the substrate when the needle is removed. In practice, however, the contact of the needle to the substrate tends to pack the fluid back into the needle orifice and upon removal of needle, the fluid separates up inside the orifice leaving a void at the end of the needle which may not be completely filled in the next cycle, resulting in no deposit occurring at that time. Conversely, upon contact between the needle and substrate, a sufficient amount of material may be pushed back into the needle orifice so that enough grip between the adhesive and the ID of needle occurs to overcome the cohesion and surface tension of the adhesive to the substrate so that a deposit of adhesive on the substrate does not take place. These problems can be partially overcome when the material droplet is fairly large compared to the bore diameter of the needle. However, in the application of small metered amounts of adhesives, the droplet size is approximately the same as the size of the needle and thus a hollow needle applicator is insufficient for this application.

SUMMARY OF THE INVENTION

It is an object of this invention to provide a mechanism that accurately meters very small amounts of thick adhesive paste in droplet form on a substrate such as a printed circuit board.

It is another object of this invention to provide an adhesive dispenser having an outer cylinder carried on a support that moves an adhesive metering device toward and away from a substrate to place minute amounts of adhesive on the substrate.

It is a further object of this invention to provide an adhesive metering device that makes a direct line deposit of the adhesive on a substrate; the device being unaffected by pressure or viscosity of the adhesive.

The present invention is an adhesive dispensing device for rapidly placing a minute droplet of adhesive on a substrate and comprises a support housing having an adhesive metering device adapted to be supplied with adhesive under constant pressure from an adhesive supply source, the metering device having a means for collecting the adhesive and making a direct line deposit of same on the substrate. A dispensing mechanism is carried by the support housing and coacts with the metering device to move the metering device toward and away from the substrate.

BRIEF DESCRIPTION OF THE DRAWINGS

Attention is now direct to the Figures of the drawing which illustrate.

DESCRIPTION OF THE PREFERRED EMBODIMENT

Figure 1:
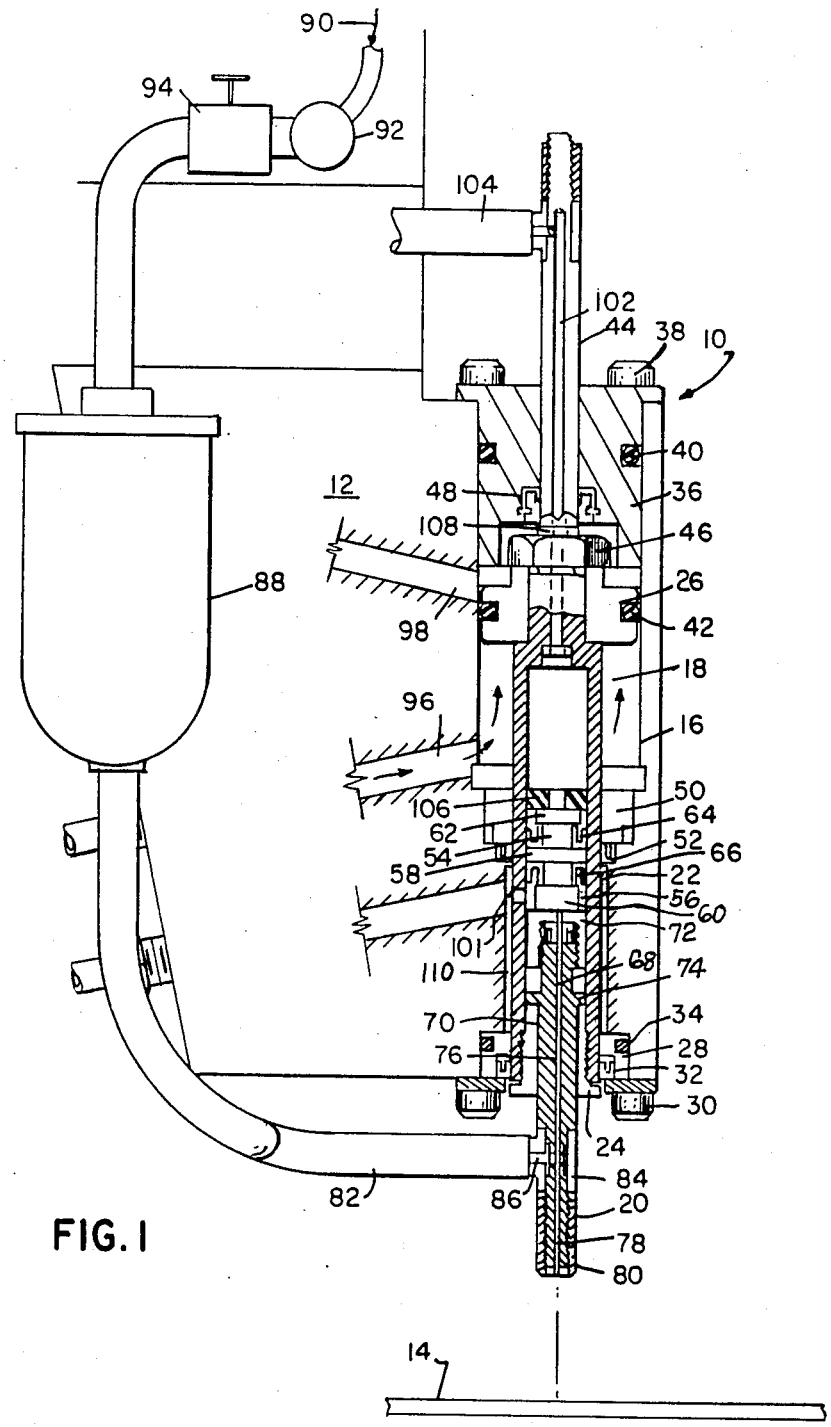
FIG. 1 is a side elevational view of the adhesive dispensing device in a non-operative condition.

Attention is now directed to FIG. 1 which illustrates the adhesive dispenser in a static or non-operative position. This dispenser was developed for metering small amounts of adhesive between the conductive lands on a printed circuit board to secure chip type electronic components to the board. However, as will become apparent hereinafter, this dispenser could be utilized in other environments where rapid application of small amounts of material to a substrate is required.

The dispenser 10 is carried on a support housing 12 positioned on a machine frame (not shown). When used in a chip placement machine, the dispenser would be positioned as illustrated in copending U.S. patent application Ser. No. 299,979 filed Sept. 8, 1981 (now U.S. Pat. No. 4,501,064 granted Feb. 26, 1985) and would place a droplet "D" of adhesive on the printed circuit board 14 between conductive lands on the board. The support housing 12 has a stepped cylindrical opening or bore 16 which houses a dispensing cylinder 18 and a metering cylinder 20 for reciprocable movement toward and away from the board during the pickup and application of the adhesive thereon.

The dispensing cylinder 18 comprises a sleeve 22 having a threaded cap 24 on the lower end thereof and a piston 26 on the upper end thereof. A lower sleeve bearing 28 is carried in the bore 16 by lock pins 30. The sleeve bearing 28 has inner and outer seals 32 and 34 respectively. An upper sleeve bearing 36 is also carried in the bore 16 by a pair of lock pins 38 and is sealed in the bore by an O-ring 40. The lower portion of bore 16 has a clearance 110 around the sleeve 22 (see FIG. 4) to prevent the sleeve 22 binding on its up and down movement, as will become apparent hereinafter.

The piston 26 is sealed in bore 16 by an O-ring 42 secured to sleeve 22 by a lock nut 46. A seal 48 in sleeve bearing 36 surrounds the tubular housing 44 which is part of sleeve 22 to provide an air tight chamber above the piston 26. The opposite end of bore 16 is sealed by a cap 50 and an annular seal 52.

The metering cylinder 20 comprises a piston 54 mounted within the bore 56 of sleeve 22. The piston 54 has a central land 58, and end lands 60 and 62 to contain seals 64, 66. The end lands 60 of piston 54 carries an adhesive metering pin 68.

Within the bore 56 is a non-wettable gland 70. Cap 72 containing a seal is threaded on the upper end of gland 70. The gland 70 also has a shoulder 74 positioned against threaded cap 24. As illustrated, metering pin 68 passes down through the bore 76 in gland 70. The pin 68 is a solid rigid member with a tight fit in the bore 76 of the gland 70. Threaded on the lower end 78 of gland 70 is a nose or nozzle member 80.

The adhesive is supplied to the metering pin by means of a flexible supply line 82 attached to a fitting 84 carried on the gland 70. The fitting has an opening or port 86 in communication with the bore 76 in which the metering pin 68 slides.

The adhesive supply line 82 is connected to a reservoir of adhesive 88 which is pressurized through an air supply 90. An air pressure regulator 92 maintains the desired constant air pressure on the reservoir to supply the adhesive to the metering cylinder at the desired rate. A shut-off valve 94 is also disposed in the adhesive supply line.

The dispensing cylinder 18 is operated for up and down movement by air supply lines 96, 98 which are in communication with bore 16 at opposite ends of the piston 26. The metering cylinder piston 54 has an air line 100 through housing 12 and in communication with the lower end of the piston 54 through opening 101 in sleeve 22. The tubular housing 44 has an opening 102 in communication with flexible air line 104 placing the upper end of piston 54 under pressure at the desired sequence in the operation of the device, as will become apparent hereinafter.

In operation, from the static condition illustrated in FIG. 1, the adhesive supply line 82 and air line 100 are pressurized. Air from air line 100 through opening 101 will raise piston 54 and metering rod or pin 68 to the position illustrated in FIG. 2. At this time the adhesive enters the bore 76 of the gland 70. The gland 70 is a non-wettable material such as tetrafluorethlene "TEFLON" to which the adhesive will not adhere.

Figure 3:
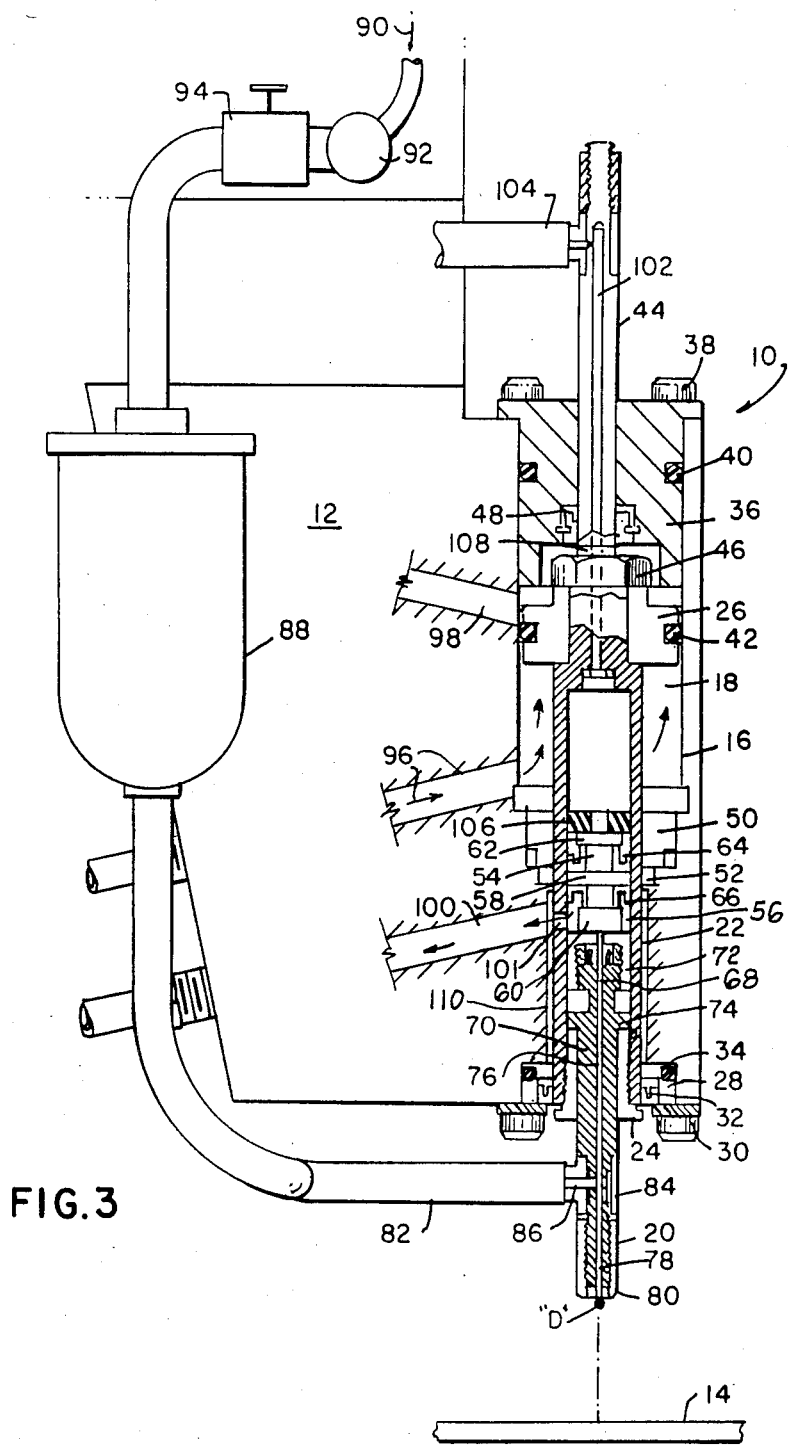
FIG. 3 is a view similar to FIG. 1 with the metering pin in a downward position after collecting the adhesive.

After this start-up stage, the adhesive reservoir is constantly pressurized. The amount of adhesive flowing into the bore 76 is a function of the flow characteristics and viscosity of the material versus flow resistance of the system, reservoir pressure and length of time that the opening or port 86 into bore 76 is open by withdrawal of metering pin 68. After raising piston 54 and metering pin 68 and the lapse of the correct time to collect the required size of a globule of adhesive in bore 76, air line 104 is activated to move pin 68 downwardly in bore 76 to collect and sever the required amount of adhesive from the main mass along the intersection of opening or port 86 into bore 76 (at this time, air is exhausted from line 100 (See FIG. 3)). Thereafter, the opening 86 is sealed by pin 68 so further adhesive cannot enter bore 76. This position of the dispenser and resulting placement of a dot "D" of adhesive on the end of pin 68 at the outlet of the dispenser is illustrated in FIG. 3. None of the droplets are lost from the collection point to the dispenser outlet because the gland is a non-wettable material and because of the close fit of the pin 68 in bore 76.

Figure 4:
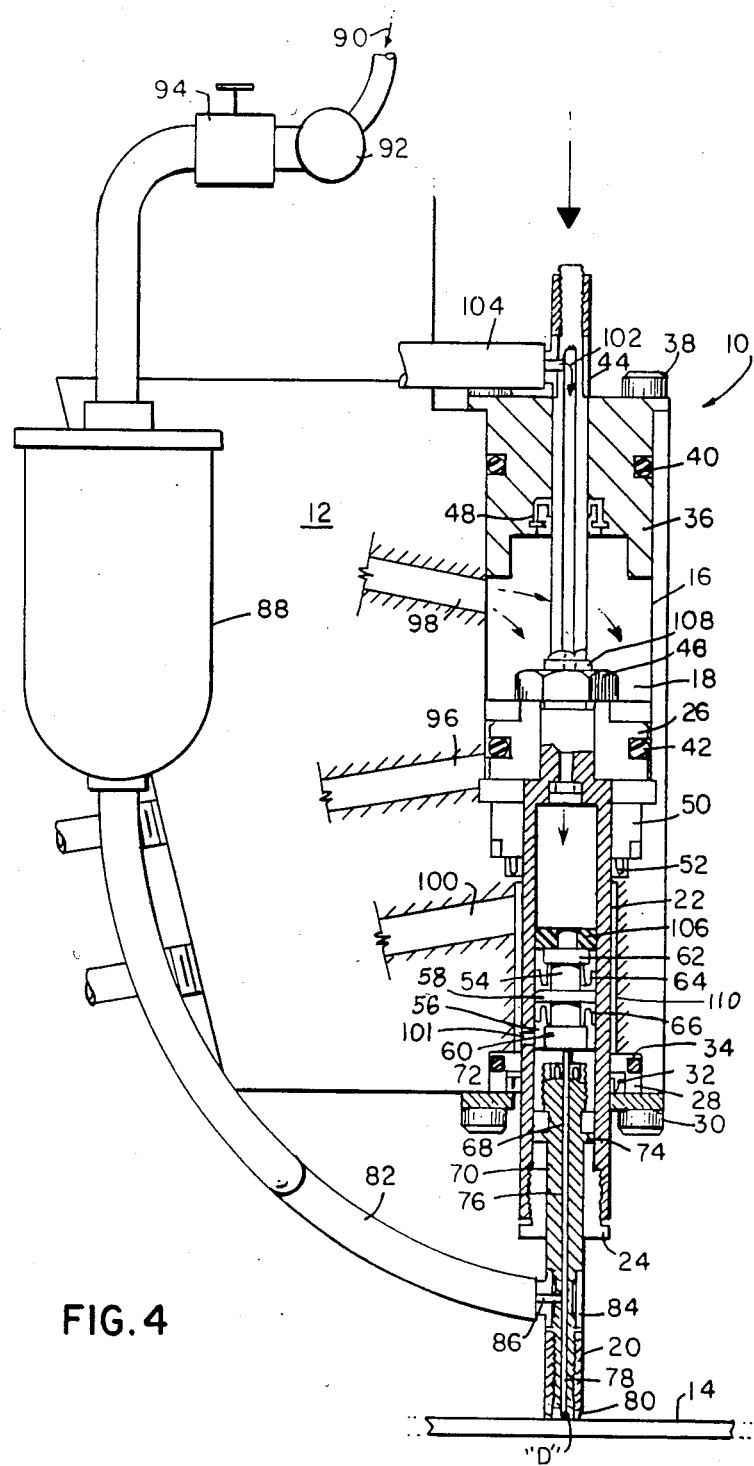
FIG. 4 is a view showing the dispenser in a downward position to apply a droplet of adhesive to a substrate.

Attention is now directed to FIG. 4 wherein the dispenser is shown moved downwardly to place the adhesive on the substrate 14. As the air line 98 is energized and the air line 104 activated, the dispensing cylinder 18 and sleeve 22 move downwardly through the support housing to a point where the nozzle or outlet 80 of the dispenser is placed in contact with the substrate and the droplet of adhesive is squeezed between the end of the pin and the work surface. This causes the droplet to spread out and ensures a good grip between the substrate and the deposit since the contact area of the droplet to the substrate is greater than the contact area of the droplet to the end of the pin 68. If in the process the adhesive contacts the gland, no adhesion occurs because the gland is a non-wettable material.

Figure 2:
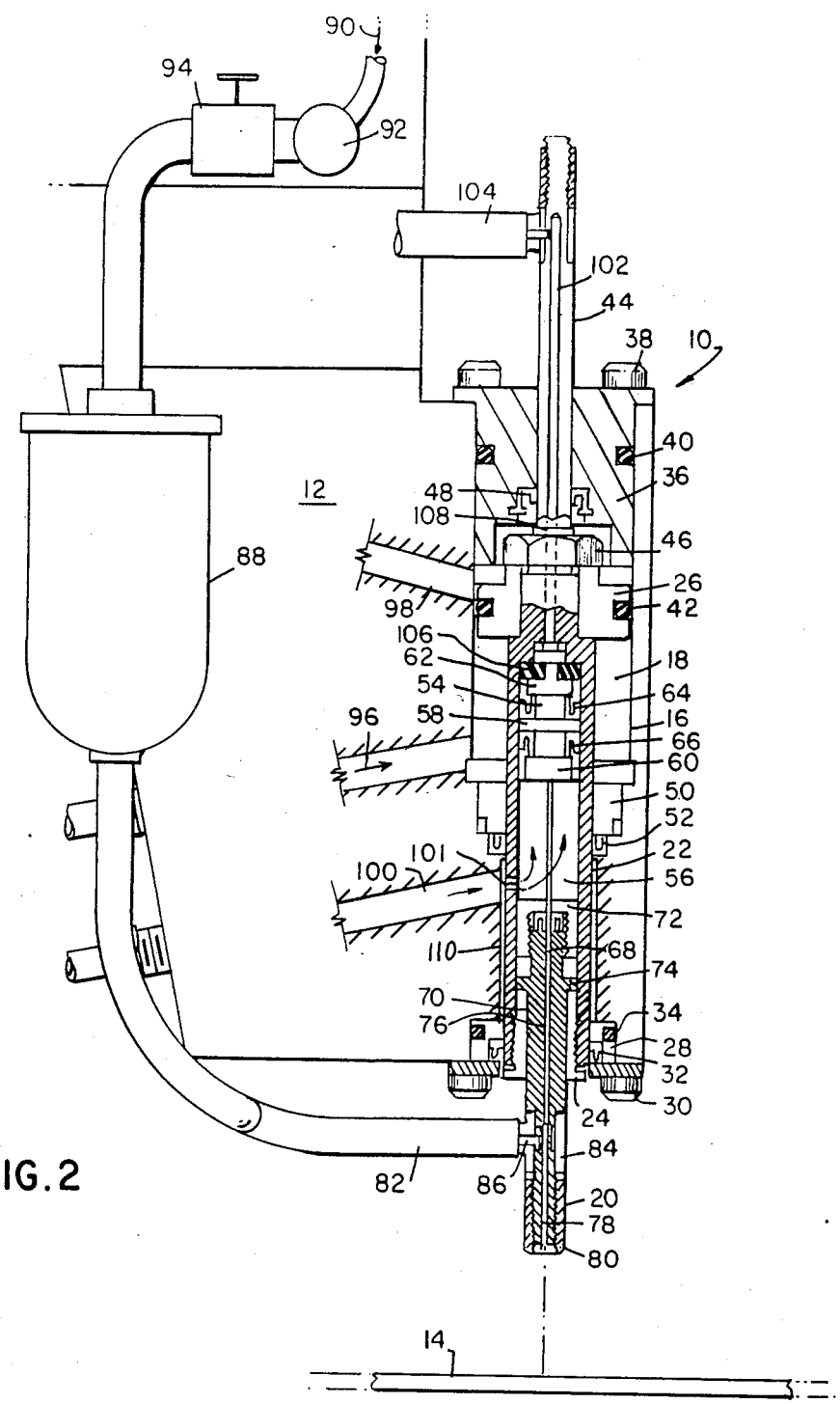
FIG. 2 is a view similar to FIG. 1 with the metering pin in a retracted position to collect a metered amount of adhesive.

In the continued operation of the dispenser, the sequences of operation illustrated in FIGS. 2 to 4 are repeated. That is, after placement of the droplet as illustrated in FIG. 4, the air lines 96 and 100 are energized to return the dispenser and metering pin to the adhesive pickup position shown in FIG. 2. On the return stroke, the bumpers 106 and 108 absorb impact of the bottoming out of the pistons 26 and 54.

The above described operation of the dispenser and specifically the air lines and adhesive reservoir pressuring source can all be controlled by any computer command programmed to the remaining functions of the other elements of a machine; in this instance a chip placement machine.

It should also be noted that an optical brightener such as "UVITEX O.B." mixed with the adhesive would aid visual inspection. When viewed under black light, adhesive droplets would stand out allowing visual inspection of missing droplets or a missing chip which should have been placed upon a droplet in the subsequent chip placement phase of the machine operation. Also, automatic inspection could be accomplished from a digitized read out of the luminous pattern of the droplets on the substrate.

It can thus be seen that the above described adhesive dispenser makes a rapid direct line deposit of a minute droplet of adhesive from the bore 76 onto a substrate. The amount of adhesive flowing into bore 6 is a function of the adhesive flow characteristics and viscosity of the material versus the flow resistance of the system, as well as the adhesive reservoir pressure and the length of time that the port 86 and the bore 76 are in communication. Since the adhesive characteristics, system resistance and reservoir pressure are all constant for a given set-up, controlling the amount of time the port 86 is open (by rapidity of movement of metering pin 68) controls the amount of adhesive admitted into bore 76 and thus the amount of the adhesive subsequently deposited on the substrate.

We claim:

1. An adhesive dispensing device for rapidly placing a minute droplet of adhesive on a substrate comprising:
    a. a support housing;
    b. an adhesive metering device adapted to be supplied with adhesive under constant pressure from an adhesive supply source;
    c. said metering device having collecting means passing through said metering device for collecting supplied adhesive and making a direct line deposit of a measured amount of adhesive to the substrate;
    d. a dispensing mechanism carried by said support housing and supporting said metering device for movement of said metering device vertically toward and away from the substrate when applying adhesive to the substrate;
    e. said metering device including a nozzle, said collecting means adapted to pass through said nozzle to deposit the adhesive on the substrate; and
    f. said dispensing mechanism includes a piston carrying a sleeve, said metering device being positioned within said sleeve for movement toward and away from said substrate.

2. The adhesive dispensing device of claim 1 including a non-wettable gland mounted to said sleeve with said collecting means being a metering pin adapted to pass through said gland.

3. The adhesive dispensing device of claim 2 wherein said gland is in communication with the adhesive supply source.

4. The adhesive dispensing device of claim 3 wherein said metering device includes a metering piston movable within said sleeve and supporting said metering pin within said gland so that said metering pin can collect a small amount of adhesive and deposit same on the substrate.

5. An adhesive dispensing device for placing a droplet of adhesive on a substrate comprising:
    a. a support housing;
    b. a double acting dispensing cylinder carried in the support housing and having a piston with opposed sides in communication with air lines to move the piston back and forth within the support housing;
    c. a sleeve mounted on said piston which houses a metering piston having the opposed sides thereof in communication with air lines for back and forth movement within said sleeve;
    d. said sleeve also having a non-wettable gland secured therein which contains a bore for receipt of a metering pin carried on said metering piston;
    e. said gland being in communication with an adhesive supply source so that during back and forth movement of said metering piston, said metering pin collects a small amount of adhesive and makes a direct line deposit of same on the substrate.

6. The adhesive dispensing device of claim 5 wherein the adhesive source is a constantly pressurized reservoir of adhesive.

* * * * *